Jan. 14, 1958

KAZUO A. YAMAKAWA

METHOD FOR PRODUCING ELECTRICAL CONTACT TO SEMICONDUCTOR DEVICES

Filed Sept. 5, 1956

2,820,135

INVENTOR.
KAZUO A. YAMAKAWA,

By Martin R. Horse

ATTORNEY.

United States Patent Office 2,820,135
Patented Jan. 14, 1958

2,820,135

METHOD FOR PRODUCING ELECTRICAL CONTACT TO SEMICONDUCTOR DEVICES

Kazuo A. Yamakawa, Los Angeles, Calif., assignor to Pacific Semiconductors, Inc., Culver City, Calif., a corporation of Delaware Application September 5, 1956, Serial No. 608,063
7 Claims. (Cl. 219—85)

This invention relates to semiconductor devices and more particularly to a new and improved method for producing electrical contact to semiconductor devices.

In the semiconductor art a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of semiconductor material has an N-type region adjacent a P-type region, the boundary between them is termed a P-N (or N-P) junction, and the specimen of semiconductor material is termed a P-N junction semiconductor device. Such a P-N junction device may be used in making a rectifier, photocell, transistor, or the like. A specimen having two N-type regions separated by a P-type region, for example, is termed an N-P-N junction semiconductor device or junction transistor, while a specimen having two P-type regions separated by an N-type region is termed a P-N-P junction semiconductor device or transistor.

These P-N or N-P junctions may be produced by the technique of fusion, or diffusion. Further, it has been found that a small area junction is in fact produced by welding a doped whisker element containing an active impurity to a semiconductor starting crystal; these are included within the class of so-called point contact devices. If the semiconductor starting crystal be of N-type conductivity, for example, and if a P-type impurity such as indium, for example, be included in the material of the whisker, then upon welding of the whisker to the semiconductor material a small area P-N junction will be produced.

These junctions be they formed by the above referred to welded whisker technique or by the fusion or diffusion method, are hereinafter referred to as rectifying junctions or simply as junctions.

It is often necessary to provide a non-rectifying junction or ohmic contact to a semiconductor device.

The method of the present invention is peculiarly adapted to the production of both rectifying and non-rectifying junctions by the welding of a whisker element which has tipped upon an end thereof a quantity of metal which will act as a binder to electrically and mechanically connect the whisker element to the semiconductor device.

The term semiconductor material as utilized herein is considered generic to germanium, silicon, germanium-silicon alloy, indium-antimonite, aluminum-antimonite, gallium-antimonite, indium-arsenite, aluminum-arsenite, zinc sulphide, gallium arsenite, lead sulfide, lead telluride, lead selenide, cadmium sulfide, cadmium telluride, cadmium selenide, and is employed to distinguish these semiconductors from metallic oxide rectifiers such as copper oxide.

The term active impurities is used to denote those impurities which affect the electrical rectification characteristics of semiconductor material as distinguished from other impurities which have no appreciable effect upon these characteristics. Active impurities are classified ordinarily as donor impurities such as phosphorus, arsenic, and antimony, or acceptor impurities such as boron, aluminum, gallium, and indium.

In the prior art as has hereinabove been mentioned, P-N junction semiconductor devices have been produced by a fusion technique which involves the fusion of small amounts of low melting point active impurities with portions of a semiconductor starting specimen. According to this prior method, a predetermined amount of low melting point acceptor impurity, such as indium for example, is placed in contact with the surface of an N-type germanium specimen or crystal. The specimen and the contacting indium are then heated to a temperature above the melting point of the indium, but below the melting point of the specimen, in order to melt the indium and dissolve therein a portion of the adjacent germanium. The specimen is then cooled and the germanium and indium are regrown onto the specimen, thereby producing an indium saturated P-type semiconductor specimen. As the specimen continues to cool, a region above the regrown region will be produced which will consist primarily of any alloy or eutectic of germanium together with the active impurity.

It has long been a problem to provide an efficient method of producing a good electrical and mechanical contact to this eutectic or alloy region, which makes ohmic contact with the regrown region thus produced.

Further, in the production of point contact diodes and transistors wherein a minute junction is produced by the passage of a forming current by pulsing the device in a forward direction, it has been found desirable to include an amount of an active impurity at the tip of the whisker. For example, should the semiconductor crystal be of N-type conductivity germanium, then in order to produce the above referred to minute junction, indium or some other P-type active impurity would be included at the tip of the whisker which is to make contact with the semiconductor crystal.

Much difficulty has been encountered in producing a whisker element which includes the necessary amount of active impurity at the tip thereof. Among the methods which have been used in the prior art with some degree of success are evaporation and plating. In both of these methods, the active impurity is disposed on the outer surface of the whisker element when, in fact, the only portion thereof at which it is desired to be included is at the very tip. The amount of impurity which can be localized at the whisker tip, where it is desired, is severely limited by the above described prior art method. In many types of point contact devices the performance characteristics are a direct function of the amount of doping impurity deposited from the whisker during the forming operation.

In the fused or diffused junction diode above referred to, the method of the present invention has been utilized with marked success in producing an efficient ohmic contact or non-rectifying contact to the diffused region, for example, or more technically accurate, to the eutectic or heavily doped region which is produced atop the diffused region during the diffusion process. One such type of diode or transistor wherein the present method is particularly useful is described in pending U. S. patent application Serial No. 602,354 entitled "Method for Diffusing Active Impurities into Semiconductor Materials," by Thomas C. Hall and Clifford A. Levi, filed August 6, 1956 and assigned to the assignee of the present invention.

In the prior art, methods for either ohmically bonding electrodes to a semiconductor crystal or for producing a point contact junction in a semiconductor crystal, a whisker is used which is partly or wholly composed of the active or doping impurity. Aluminum and gold and alloys of these metals have been and are being so used. They, however, have the common disadvantage of being non-resilient, a quality which is important to maintain a mechanically rugged device. The springiness is used also to push the whisker into the crystal during pulsing by an advance of approximately 3 mils.

The present invention overcomes the above and other difficulties of the prior art. According to the basic concept of the present invention, methods are disclosed for producing a non-rectifying, low impedance ohmic electrical and mechanical connection to a semiconductor crystal, and also for creating small area rectifying junctions within the crystal by fusing an active impurity into the crystal from the tip of a resilient whisker element.

More particularly, according to a preferred embodiment of the present invention a point contact semiconductor device is produced by welding a molybdenum or tungsten whisker element to a body of solid solder material including indium to produce an indium tipped molybdenum whisker. The whisker is then brought into critical mutual contact with an N-type conductivity silicon crystal, for example, and a forming current is passed through the whisker crystal series combination to thereby produce a small area P–N junction in the immediate vicinity of the whisker.

In addition the present invention provides methods for creating an efficient ohmic contact to a semiconductor device.

Accordingly, it is an object of the present invention to provide a new method for depositing a solder material on a whisker element.

Another object of the present invention is to provide a new method for depositing a solder material onto the tip of a resilient whisker element.

Yet another object of the present invention is to provide a new method for depositing an active impurity material confined to the tip of a whisker element.

A further object of the present invention is to provide a method for producing an improved ohmic connection to a semiconductor crystal body.

Yet a further object of this invention is to provide a new method for producing a new point contact semiconductor device.

A still further object of the present invention is to provide a new method for producing a mechanical and electrical connection to the alloy region which covers a fused or diffused region in a semiconductor crystal.

The novel features which are believed to be characteristic of the present invention, both as to its organization and method of operation together with other objects and advantages thereof, will be better understood from the following description considered in connection with the accompanying drawing in which several embodiments of the invention are illustrated by way of example. It is to be expressly understood, however, that the drawing is for the purpose of illustration and description only, and is not intended as a definition of the limits of the invention.

Figure 3:
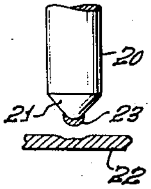
Figure 3 shows the whisker element of Figure 1 after it has been withdrawn from the solder material during a subsequent step according to the method of the present invention.
Figure 8:
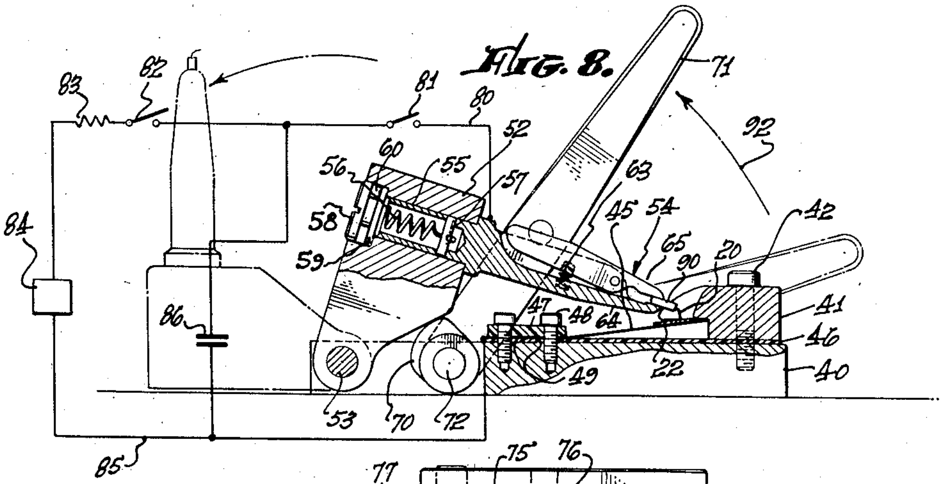
Figure 8 is a front elevation and schematic combination showing an apparatus which may be used to practice the method of the present invention.
Figure 9:
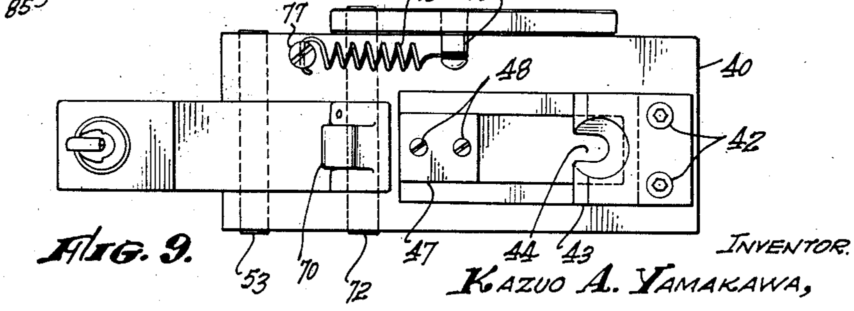
Figure 9 is a plan view of the apparatus shown in Figure 8.

In the various figures of the drawings, with the exception of Figures 8 and 9, the elements shown therein are greatly enlarged with the whisker dimensions being even more greatly exaggerated. The diameter of the whisker element, for example, is of the order of magnitude from 0.001 to .005 of an inch, while the thickness of the solder material of Figure 3 is of the order of magnitude of .0001 to .002 of an inch.

Figure 1:
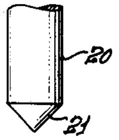
Figure 1 is a view of the pointed end of a whisker element employed in the method of the present invention.

Referring now to the drawings, there is shown in Figure 1 a view of the pointed end of whisker element 20 which is typical of that used in many presently produced point contact diodes or transistors. An example of such a diode employing this type of whisker may be found in U. S. Patent No. 2,694,168, entitled, "Glass-Sealed Semiconductor Crystal Device" by H. Q. North et al., dated November 9, 1954. The whisker element described in the present invention may in the final semiconductor device assume any configuration presently known in the art, such as the S-shape or C-shape. Any design which will result in imparting at least some degree of resiliency is satisfactory.

This requirement for resiliency of the whisker 20 centers around three factors. The most important factor is that previously mentioned, i. e., upon welding the whisker should advanace toward the crystal in order to insure continual critical contact during the welding operation. If the whisker is brittle or soft, it will not be structurally strong and will therefore not lend itself to a rugged device. Further, the finished diodes and transistors are often subjected to extreme temperatures and temperature gradients. Therefore, it is desirable that a certain amount of play be permissible to absorb the thermal expansion and contraction of the whisker which will result from its subjection to these temperatures. Materials which have proven satisfactory in view of the above physical requirements for the whisker are materials such as tungsten and molybdenum.

While the end of whisker element 20 has been shown to terminate in a symmetrical point 21, this is not to be considered as a limiting feature of the present invention. The end 21 of whisker 20 has also been successfully made with an oblique point and as a matter of fact, with no point at all. The particular shape of the end 21 of whisker 20 is a function of production expediency, in part and the desired device parameters in part. In some application a larger area contact may be preferable, in which case the end 21 may not be reduced in area at all.

Figure 2:
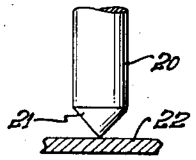
Figure 2 is a view showing the whisker element of Figure 1 in contact with a body of solid solder material during an intermediate step according to the method of the present invention.

In Figure 2, there is shown the whisker of Figure 1 which has been brought into contact with a solid body of solder material 22 by an apparatus not shown in this view. While the solder material herein shown is depicted as a thin sheet or wafer, such is not intended as a limitation of its form. The term "solder" as applied to body 22 is intended to include, with certain limitations hereinafter to be mentioned, a metal which is employed in the joining of two other metal surfaces and which is thereto applied in a molten state. Pure metals may be used as solder 22 as well as alloys.

It is generally agreed that one of the requisites for a solder, as the term is generally used, is that its melting point be considerably lower than that of the metals being joined. While this requirement has not been found to be particularly critical, i. e., satisfactory devices have been produced using a solder material 22 with a melting point almost that of the whisker 20, it has been found that a more satisfactory and reliable result is achieved when such a requirement is abided.

After the whisker 20 has been brought into contact at its end 21 with body 22, a relatively high current is passed through the whisker body series combination. The apparatus for producing this current will hereinafter be discussed. Suffice to say, that the current for an alloy comprising approximately 99% gold and 1% indium as the solder material and for a molybdenum wire of 0.003 inch in diameter has a peak value of 40 amperes, for example. The duration of the current pulse is as follows: There is a rise time of 50 $\mu$s. to this 40 ampere peak while the delay time to $1/e$ is approximately 100 $\mu$s.

All of the above values and parameters are by way of example only and should not be considered as limiting the method of the present invention. All of these values may be varied within reasonable limits and they are further interdependent so that a reduction in current, for example, would require a commensurate increase in pulse time.

The possible areas and extent of variation in each of the above parameters will hereinafter be discussed.

What is particularly important in determining the value of current and in selecting the whisker and solder material are the following:

The melting point of the whisker material should be above that of the solder material. The pulsing current which is passed through the whisker solder combination need provide a quick and localized heat at their mutual contact point in order to weld a portion of the solder material to the tip of the whisker in contact therewith. In order for this to obtain, the solder material upon being melted by the pulsing current, must wet the whisker material. At the same time, the geometry of the point of the whisker subsequent to this welding operation must not be appreciably altered due to the heat produced by the welding current. This latter requirement is of particular importance in view of the following. The overall length of the whisker must remain substantially unaltered. The area of contact between the tip of the whisker and the crystal to which it is to be joined need be controlled.

It should also be mentioned in passing that the pulsing current when joining the tipped whisker to the semiconductor crystal must be limited to the forward current carrying capacity of the device itself.

Again referring to the drawing, there may be seen in Figure 3 the whisker 20 of Figure 2 after the pulsing current has passed through and welded a small portion 23 of body 22 to the tip of whisker 20. Thereafter, the whisker 20 is withdrawn from body 22 carrying with it upon the now somewhat flattened end 21 of whisker 20 that small portion 23 of body 22.

Figure 4:
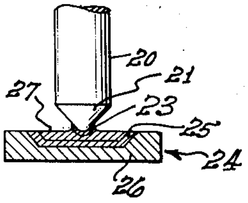
Figure 4 is a view showing the whisker element of Figure 1 after it has been welded to a fused junction diode which is shown in cross section according to one method of the present invention.

In Figure 4, there is shown one application of the tipped whisker of Figure 3, wherein it is employed as an ohmic or non-rectifying contact to the regrown region 25 of semiconductor crystal diode 24. Crystal diode 24 is shown in cross section and is intended to exemplify a so-called fused junction diode which may be prepared by any method known to the art. One such method has hereinbefore been discussed. The diode 24 may, for example, comprise an N-type conductivity silicon crystal 26 which has a P-type regrown region 25 resulting in a P-N junction there between. In order to effectively produce an efficient electrical and methanical ohmic contact to the regrown region 25, the tipped whisker of Figure 3 is first brought into critical mutual contact with the heavily P-type doped region 27 which will have resulted atop regrown region 25 during the fusion process. If an indium pellet had, for example, been utilized in producing regrown region 25, then region 27 will be a heavily indium doped silicon region.

In order to insure the best possible ohmic connection to region 27 which in this example is assumed to be a heavily P-doped silicon region, it has been found preferable, but not necessary, to include a P-type impurity in the solder material 22. Further, it is desirable that such impurity be the same as that contained within region 27, although this too is not necessary.

After whisker 20 has been brought into contact with region 27, an electric current is passed through the whisker diode series combination to effectively join the whisker tip 23 to the heavily doped region 27. The current parameters for this particular operation for example, may actually be the same as that used to weld portion 23 to the tip of whisker 20.

Figure 5:
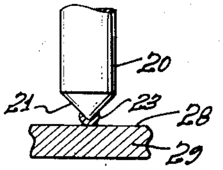
Figure 5 is a view of the whisker of Figure 1 after it has been tipped and brought into contact with a semiconductor crystal wafer according to another method of the present invention.
Figure 6:
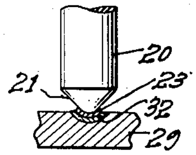
Figure 6 shows the whisker of Figure 5 and the crystal of Figure 5 after the forming current has been passed through the whisker and crystal series combination to form a point contact diode according to a method of the present invention.

Figures 5 and 6 are shown to illustrate how the tipped whisker of Figure 3 might be utilized in producing a so-called doped point contact welded diode. As was hereinbefore stated, a doped whisker is often used for producing a welded point contact diode. Herein whisker 20 which has previously welded at the tip 21 thereof, a quantity of solder material such as gold-antimony alloy is brought into critical mutual contact with surface 28 of P-type conductivity germanium crystal 29, for example.

Again it should be borne in mind that the semiconductor crystal, be it that illustrated in Figures 5 and 6 or any other, may be of any semiconductor material such as those herebefore enumerated. Further, it may be either of N or P type conductivity.

Assuming that crystal 29 is N-type conductivity germanium, then if gold-gallium solder material be welded as shown at 23 to the tip 21 of molybdenum whisker 20, for example, upon the passage of a forming current through the whisker crystal combination at region 32 of crystal 29 as shown in Figure 6, there will be produced a P-type conductivity region resulting in a minute P-N junction.

Heretofore gold has been mentioned as the predominant metal of solder material 22. While this has been found to be singularly successful in certain devices, it is by no means the only metal permissible. Gold is chiefly used because of its ability to dissolve the semiconductor crystal material upon being heated by the welding current. This is desirable to aid in carrying the active impurity into the molten semiconductor material. However, other alloys such as those of aluminum, platinum, and silver, have been satisfactorily employed in above described methods, as well as has gold.

Figure 7:
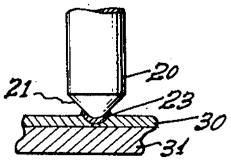
Figure 7 is a view showing the whisker element in ohmic contact with the diffused region of a semiconductor diode.

Figure 7 illustrates how the tipped whisker of Figure 3 might be employed to effect an ohmic contact to diffused region 30 of junction device 31. If region 30 be of P-type conductivity, then the doping material contained in solder material 23 would preferably include a P-type active impurity such as indium, for example, together with a major proportion of the bonding material such as gold, for example. As discussed above, gold here used would serve the purpose of bonding the whisker 20 to region 30 acting as a solvent metal to aid in this bonding effect by aiding in dissolving some of the P-type area of region 30 by the melting of the gold and the indium in order to get the indium into the germanium dissolved.

In Figure 8, there is shown a front view of an example of one particular design for an apparatus to practice the present invention. A schematic of the basic electrical circuit employed to produce the desired welding current to weld the solder material to the tip of the whisker is also shown in this figure. Base 40 has fastened at one end thereof guide member 41 by means of screws 42. Guide member 41 which is made of an insulator has a slot 44 thereon to permit whisker 20 to be inserted therein in order to make contact with the sheet of solder material 22. The sheet of solder material 22 is disposed upon flat metal spring 45 which is held in place atop insulator plate 46 which rests upon face 40. Insulator block 47 serves to secure the base of flat spring 45 by means of screws 48. Two holes 49 are provided in spring 45, which holes are substantially larger than the outside diameter of screws 48. This is necessary in order to preclude the possibility of the metal screws coming into electrical contact with the sheet of solder material 22 through spring 45. At the other end of base member 40 there is joined clamp member 52 which pivots about pin 53. Spring clamp 54 is received in hole 55 of member 52 and is held securely in place by means of spring 56 which has one end connected to clamp 54 through stud 57. The opposite end of spring 56 is fastened to pin 58. Below pin 58 is washer 59 which rides upon ball bearing 60. This spring ball bearing arrangement to secure clamp 54 within member 52 permits rotation of the clamp 54 within member 52.

Within clamp member 54 is biasing spring 63 which serves to bias jaws 64 and 65 of clamp 52 together.

Pivot member 52 has its angular position determined by cam 70. Cam 70 is in turn controlled by lever arm 71 through pivot pin 72. Finally, lever 71 is held by spring 75 by means of pin 76 to base member 40, the other end of spring 75 being fastened to pin 77.

Lead 80 is connected at one end to clamp 54 while the other end is connected through switch 81, switch 82, and resistor 83 to D. C. power supply 84. The other end of D. C. power supply 84 is connected to one corner of the spring 45 through lead 85. And capacitor 86 is connected across leads 80 and 85.

In operation, this procedure is followed. The whisker element 20 to be tipped, having been previously welded to metal pin 90 for example, such as described in co-pending U. S. patent application of Justice N. Carman, Jr. entitled Glass Sealed Crystal Rectifier, Serial No. 497,353 filed March 21, 1955, is placed in between jaws 64 and 65 of clamp 54, pin end first. This is done after lever 71 has been moved in direction of arrow 92, thereby raising clamp member 54 by the action of cam 70 upon pivot member 52. Thereafter, lever 71 is lowered causing the end 21 of whisker 20 to come into contact with the end of the sheet of solder material 22, through the action of cam 70 upon pivot member 52.

Subsequent to the contact between solder material 22, the tip of whisker 20 switch 82 is closed to permit capacitor 86 to be charged by D. C. power supply 84 through resistor 83. Then switch 81 is closed to cause capacitor 86 to discharge through the whisker solder series combination to weld the tip 21 of whisker 20 to that portion of solder material 22 with which it is in contact. Now lever 71 is again raised to withdrawn whisker 20 from solder material 22 resulting in a quantity of solder material which has been welded to tip 21 to be withdrawn from sheet 22 as shown at 23 in Figure 3.

The methods of the present invention, while discussed with diodes as examples are equally applicable to multi junction or multi control devices for producing superior transistors.

There has thus been disclosed a new and novel method for producing an efficient ohmic contact to a semiconductor crystal and for producing so-called welded point contact devices.

What is claimed as new is:

1. The method of electrically and mechanically connecting a whisker element to a semiconductor crystal, said method including the steps of: bringing the end of a whisker element into contact with a body of solid solder; passing an electric current through the whisker and solder series combination to weld a portion of the body of solder to the end of said whisker element; withdrawing said whisker element from said solder with said portion thereof welded thereto; and welding said end of said whisker element having said solder welded thereto to said semiconductor crystal.

2. The method of electrically and mechanically connecting a whisker element to a semiconductor crystal, said method including the steps of: placing the end of a whisker element into critical mutual contact with a body of solid solder material; passing an electric current through the whisker and the solder series combination, thereby welding a portion of said solder material to the end of said whisker element; and welding said end of said whisker element having said solder welded thereto to said semiconductor crystal by passing an electric current through said whisker element and said crystal series combination.

3. The method of ohmically connecting a resilient whisker to a semiconductor crystal of a predetermined conductivity type, said method including the steps of: welding a small quantity of solder to one end of a whisker element; bringing said one end of said whisker element into critical mutual contact with a surface of a semiconductor crystal body; passing an electric current through said whisker element and crystal body series combination, thereby to weld said element to said body.

4. The method of producing a point contact silicon semiconductor diode, said method including the steps of: welding a small quantity of solder including an acceptor impurity to one end of a resilient whisker element; bringing said one end of said whisker element into critical mutual contact with a surface of an N-type conductivity silicon semiconductor crystal body; and passing an electric current through said whisker element and said crystal body series combination thereby to weld said whisker element to said body.

5. The method of electrically and mechanically connecting a pointed whisker element to a semiconductor crystal, said method including the steps of: bringing the pointed end of a resilient whisker element into contact with a solid metal; passing current through the whisker metal combination to weld a portion of the solid metal to the pointed end of said whisker element; withdrawing said whisker element from said solid metal with said portion thereof welded thereto; and welding said pointed end of said whisker element to said semiconductor crystal.

6. The method of ohmically connecting a resilient whisker element to a heavily doped P-type region of semiconductor material, said method including the steps of: bringing the end of a whisker element into contact with a body of solid solder; passing an electric current through the whisker and solder series combination to weld a portion of the body of solder to the end of said whisker element; withdrawing said whisker element from said solder with said portion thereof welded together; and welding said end of said whisker element having said solder welded thereto to said semiconductor crystal, said solid solder comprising at least 99% gold and 1% of an acceptor impurity by weight; passing an electric current through the whisker and solder series combination to weld a portion of the body of solder to the end of said whisker element; withdrawing said whisker element from said solder with said portion thereof welded together; and welding said end of said whisker element having said solder welded thereto to said semiconductor crystal.

7. The method of ohmically connecting a resilient whisker element to a heavily doped N-type region of semiconductor material, said method including the steps of: bringing the end of a whisker element into contact with a body of solid solder, said solid solder comprising at least 99% gold and 1% of a donor impurity by weight; passing an electric current through the whisker and solder series combination to weld a portion of the body of solder to the end of said whisker element; withdrawing said whisker element from said solder with said portion thereof welded together; and welding said end of said whisker element having said solder welded thereto to said semiconductor crystal.

References Cited in the file of this patent

UNITED STATES PATENTS

| | | |
|---|---|---|
| 2,644,852 | Dunlap | July 7, 1953 |
| 2,705,767 | Hall | Apr. 5, 1955 |
| 2,705,768 | Kleimack et al. | Apr. 5, 1955 |
| 2,721,965 | Hall | Oct. 25, 1955 |